(12) United States Patent
Othmezouri et al.

(10) Patent No.: US 11,189,907 B2
(45) Date of Patent: Nov. 30, 2021

(54) THREE-DIMENSIONAL ELECTRONIC CIRCUIT

(71) Applicants: TOYOTA MOTOR EUROPE, Brussels (BE); TEADE AB, Lindome (SE)

(72) Inventors: Gabriel Othmezouri, Brussels (BE); Harald Merkel, Lindome (SE)

(73) Assignees: TOYOTA MOTOR EUROPE, Brussels (BE); TEADE AB, Lindome (SE)

( * ) Notice: Subject to any disclaimer, the term of this patent is extended or adjusted under 35 U.S.C. 154(b) by 0 days.

(21) Appl. No.: 16/489,054

(22) PCT Filed: Feb. 28, 2017

(86) PCT No.: PCT/EP2017/054673
§ 371 (c)(1),
(2) Date: Aug. 27, 2019

(87) PCT Pub. No.: WO2018/157919
PCT Pub. Date: Sep. 7, 2018

(65) Prior Publication Data
US 2020/0014091 A1 Jan. 9, 2020

(51) Int. Cl.
*H01Q 1/22* (2006.01)
*H01Q 13/02* (2006.01)
*H05K 1/02* (2006.01)
*H05K 1/14* (2006.01)

(52) U.S. Cl.
CPC ........... *H01Q 1/2283* (2013.01); *H01Q 13/02* (2013.01); *H05K 1/0243* (2013.01); *H05K 1/144* (2013.01); *H05K 2201/041* (2013.01); *H05K 2201/10098* (2013.01)

(58) Field of Classification Search
CPC .... H05K 1/144; H05K 1/0284; H05K 1/0243; H05K 2201/041; H05K 2201/10098; H01Q 1/2283; H01Q 13/02; H01Q 1/38; H01Q 1/3233
See application file for complete search history.

(56) References Cited

U.S. PATENT DOCUMENTS 7,613,010 B2 * 11/2009 Ono .................... H01L 23/5385
361/784
8,570,237 B2 * 10/2013 Brown ............... H01Q 21/0025
343/876

(Continued)

FOREIGN PATENT DOCUMENTS

WO 2013/190437 A1 12/2013
WO 2016/092084 A1 6/2016

OTHER PUBLICATIONS

International Search Report for PCT/EP2017/054673 dated Nov. 21, 2017 (PCT/ISA/210).

(Continued)

*Primary Examiner* — Don P Le
(74) *Attorney, Agent, or Firm* — Sughrue Mion, PLLC

(57) ABSTRACT

The present disclosure relates to an electronic circuit having a three-dimensional design by comprising a set of two-dimensional electronic circuits, wherein the two-dimensional electronic circuits are coupled with each other by radiation. The disclosure further relates to a radar antenna system.

15 Claims, 8 Drawing Sheets

(56) References Cited

U.S. PATENT DOCUMENTS

| | | | |
|---|---|---|---|
| 2006/0289981 A1* | 12/2006 | Nickerson | H01L 25/18 257/686 |
| 2007/0053167 A1* | 3/2007 | Ueda | H01L 23/3121 361/717 |
| 2009/0218701 A1* | 9/2009 | Rofougaran | H01L 23/645 257/778 |
| 2011/0183617 A1* | 7/2011 | Behzad | H04W 84/18 455/41.2 |

OTHER PUBLICATIONS

Written Opinion for PCT/EP2017/054673 dated Nov. 21, 2017 (PCT/ISA/237).

* cited by examiner

Quasioptical Amplifier Substrate, Top View

THREE-DIMENSIONAL ELECTRONIC CIRCUIT

CROSS REFERENCE TO RELATED APPLICATIONS

This application is a National Stage of International Application No. PCT/EP2017/054673 filed Feb. 28, 2017.

FIELD OF THE DISCLOSURE

The present disclosure is related to three-dimensional electronic circuits, in particular configured for a THz and/or submillimeterwave signal manipulation, and more particularly to Terahertz radar antennas.

BACKGROUND OF THE DISCLOSURE

Conventional electronic circuits are organized in two dimensional structures. A typical circuit consists of a set of units. Typically the two-dimensional form of an electronic circuit is obtained by providing the units on a two dimensional board, e.g. a PCB. Each unit is designated to perform certain tasks on ingoing signals and couples the processed signal to outgoing signals. Signals are transported using wires, connectors or traces on printed circuits. Signals interlinking units are constructed in the same way. There are cases where specialized circuitry is needed to convert signals from the level space provided in one unit to another one. The simplest case is the usage of dc block circuitry to adjust prescribed static voltage values on lines, where high frequency signals are transferred.

However, for higher frequency signals (>100 GHz) traditional lines exhibit radiation and dielectric losses: Wires and connectors radiate and the available substrates for printed circuitry become lossy.

As circuits get more and more complex, more interconnects between units are required. Each interconnect adds up to the system cost and reduces reliability. Today, interconnects are the major cause of failure.

Some MMICs (Monolithic Microwave Integrated Circuits) use integrated antennas for RF signal output by radiation. These signals are not captured by other antennas in the system but the signals are radiated outside the system, cf. e.g. Yogesh Karandikar (2012): «Integration of Planar Antennas with MMIC Active Frontends for THz Imaging Applications" CHALMERS UNIVERSITY OF TECHNOLOGY, Göteborg, Sweden.

However, even most MMIC chips face the problem that a perfect working chip must be packaged. Packaging and the associated bonding wire losses degrade the chip performance greatly. The higher RF frequency one uses, the worse the problem becomes.

Furthermore mutul coupling between antennas (i.e. radiation coupling) is seen detrimental and must be reduced, cf. e.g. Ahmad Emadeddin et al (2017): "High mutual coupling reduction between microstrip patch antennas using novel structure", AEU—International Journal of Electronics and Communications, Volume 71, January 2017, Pages 152-156.

SUMMARY OF THE DISCLOSURE

Currently, it remains desirable to provide an electronic circuit which allows complex forms of circuits and at the same time reduced losses.

Therefore, according to embodiments of the present disclosure, an electronic circuit is provided having a three-dimensional design by comprising a set of two-dimensional electronic circuits. The two-dimensional electronic circuits are coupled (e.g. electronically coupled and/or electro-magnetically coupled) with each other by radiation.

Accordingly, for complex circuits, 2D space is not sufficient. Circuits in 3D offer the required amount of interconnects at minimum interconnect length. Avoiding connectors, the only way circuits can be connected is by radiation. Desirably, using polarization and other forms of multiplexing, the same space can be used for more than one signal.

New circuit topologies can be constructed (dense meshed circuits) that are impossible otherwise.

According to the disclosure, a circuit consists of units located in 3D space. These units may be grouped in clusters, where all members of a cluster are conventionally connectible using as known from the art. A layered circuit is a special case of this, where clusters are grouped on each layer.

For complex, high frequency systems, one has to embrace the third dimension. In this effort, the circuit is treated as a field problem: Instead of using wires and lines to transfer signals within a system, radiative elements are used.

Radiative elements are not necessarily simple "capacitive couplers", "inductive couplers" or "antennas" as known of the Prior Art. Radiative elements are rather line-like (or antenna-like) structures that have been optimized to couple signal to another radiative element (of same or other type) located close-by. Now the strength (damping and phase) of a coupling between two radiative elements determines the coupling between the circuit elements. This may be exploited in-plane (such as to avoid bias-decoupling circuits) or out-of-plane being the building brick of three dimensional circuits.

Signals interconnecting units in a circuit may be categorized in two types: Slow and Fast signals. Slow signals (connecting on the same cluster of the circuit) are implemented using wires as in the prior art. Fast signals (and slow signal connecting different clusters of the circuit) are implemented using field coupling. A frequency could be considered "low" when it is smaller than the radar operational frequency minus the radar bandwidth.

Any signal in between the radar operational frequency is "high" frequency (i.e. greater than a predetermined frequency). For a multi-step up-and down conversion radar, any frequency smaller than the first, lowest upconversion frequency minus the bandwidth of the upconverter is considered "low" (i.e. smaller than a predetermined frequency).

For typical radars, the upconversion is around 2 to 5 GHz. So anything lower than 2 GHz could be seen as low frequency. As a further example, "high" may mean 70 GHz to 300 Ghz (or more). "Low" may mean any frequency that may be realized by a microstrip, e.g. from DC (0 Hz) to 2.45 GHz.

Field coupling may be achieved by metallic structures put into the near field of each other. In between the metallic structures one may place guiding structures. These may be dielectric or metallic, resonant or non-resonant.

Above metallic structure pairs may be designed either as pairs of weakly radiating transmission lines or as pairs of antennas where the other structure's presence should be taken into account.

The two-dimensional electronic circuits may comprise radiative elements. The radiative elements may be arranged on the two-dimensional electronic circuits and in the near field of each other. The radiative elements may be configured to provide the coupling between the two-dimensional electronic circuits.

The electronic circuit may further comprise guiding structures arranged between the radiative elements configured to modify the coupling field between the radiative elements.

The coupling between the two-dimensional electronic circuits may be a capacitive coupling, inductive coupling and/or a resonant antenna coupling.

The set of two-dimensional electronic circuits may be stacked. They may e.g. form a stack, e.g. in case of circuit boards (.g. PCBs) comprising the two-dimensional electronic circuits), these may be arranged as a stack of circuit boards.

The electronic circuit may be configured to generate an electric output signal in a first one of the set of two-dimensional electronic circuits. The electric output signal may be transmitted via radiation to a second one of the set of two-dimensional electronic circuit. The electric output signal may be processed in at least one of the two-dimensional electronic circuits.

At least one of the two-dimensional electronic circuits may comprise: a radiation coupled amplifier configured to amplify the electric output signal, and/or a radiation coupled transmitter configured to multiply the frequency of the electric output signal.

The electronic circuit may be configured to receive an electric input signal in a last one of the set of two-dimensional electronic circuits. The electric input signal may be transmitted via radiation to a preceding one of the set of two-dimensional electronic circuits. The electric input signal may be processed in at least one of the two-dimensional electronic circuits.

At least one of the two-dimensional electronic circuits may comprise: a radiation coupled receiver configured to filter the electric input signal, and/or a radiation coupled amplifier configured to amplify the electric input signal.

At least one of the two-dimensional electronic circuits may comprise a radiation coupled transceiver configured to process an electric output signal and an electric input signal.

At least one of the two-dimensional electronic circuits may comprise a radiative element configured to split an amplification power for amplifying an electric output signal and an electric input signal.

The present disclosure further relates to an antenna system, comprising: an electronic circuit according to any of the preceding claims configured to generate a radio output signal, e.g. at more than 100 GHz.

The radio output signal is desirably a far field signal. There are though applications, where one could theoretically think about a near field application. For frequencies above 100 GHz and typical antenna apertures of some mm, the far field zone is reached already at 3 . . . 5 mm distance. So near field applications would be e.g. millimeterwave microscopes.

The antenna system may comprise a horn antenna arranged on a last one of the set of two-dimensional electronic circuits. The horn antenna may be configured to transform the guided electric output signal into the radio output signal of the antenna system.

The antenna system may comprise a horn antenna arranged on a last one of the set of two-dimensional electronic circuits. The horn antenna may be configured to transform a radio input signal into the guided electric input signal.

The present disclosure further relates to a radar antenna system comprising the antenna system as described above. The present disclosure may also relate to a radar antenna system comprising an array of a plurality of antenna systems as described above.

The radar antenna system may comprise a plurality of stacked two-dimensional electronic circuits, wherein at least one is shared by the plurality of antenna systems of the array.

From a functional point of view there may be circuits distributed on several boards (e.g. filters on their own a small board soldered on a bigger one).

The antenna systems may comprise at least one two-dimensional electronic circuit configured to be operated at frequency being smaller than a predetermined frequency.

At least one two-dimensional electronic circuit e.g. may be configured to be operated at a frequency smaller than a lowest upconverter or operational frequency, more in particular smaller than 2 GHz, the at least one low frequency electronic circuit being shared by the plurality of antenna systems of the array.

Accordingly, at least one two-dimensional electronic circuit may comprise at least one upconverter.

An upcoverter may be an electronic means configured to "move" a signal up in spectrum whereas a multiplier may "stretch" a signal. Therefore, sending two signals (e.g. at 1 GHz with 1 MHz apart=1.001 GHz) to an upconverter (e.g. to 100 GHz), two signals will be obtained, one at 101 GHz and one at 101.001 GHz. Frequencies may be simply added.

Sending the same signal to a multiplier, e.g. to the same RF frequency 100 GHz, the first signal may be at 100 GHz and the other at 100.1 GHz. Frequencies may be multiplied by the multiplier.

A frequency may be considered "low" when it is smaller than the radar operational frequency minus the radar bandwidth. Any signal in between the radar operational frequency is "high" frequency.

For a multi-step up- and down conversion radar, any frequency smaller than the first, lowest upconversion frequency minus the bandwidth of the upconverter is considered "low".

For typical radars, the upconversion is around 2 to 5 GHz. So anything lower than 2 GHz may be seen as low frequency.

The antenna systems may comprise each at least one separate two-dimensional electronic circuit configured to be operated at frequency being greater than a predetermined frequency.

It is intended that combinations of the above-described elements and those within the specification may be made, except where otherwise contradictory.

It is to be understood that both the foregoing general description and the following detailed description are exemplary and explanatory only and are not restrictive of the disclosure, as claimed.

The accompanying drawings, which are incorporated in and constitute a part of this specification, illustrate embodiments of the disclosure and together with the description, serve to explain the principles thereof.

DESCRIPTION OF THE EMBODIMENTS

Reference will now be made in detail to exemplary embodiments of the disclosure, examples of which are illustrated in the accompanying drawings. Wherever possible, the same reference numbers will be used throughout the drawings to refer to the same or like parts.

Figure 1:
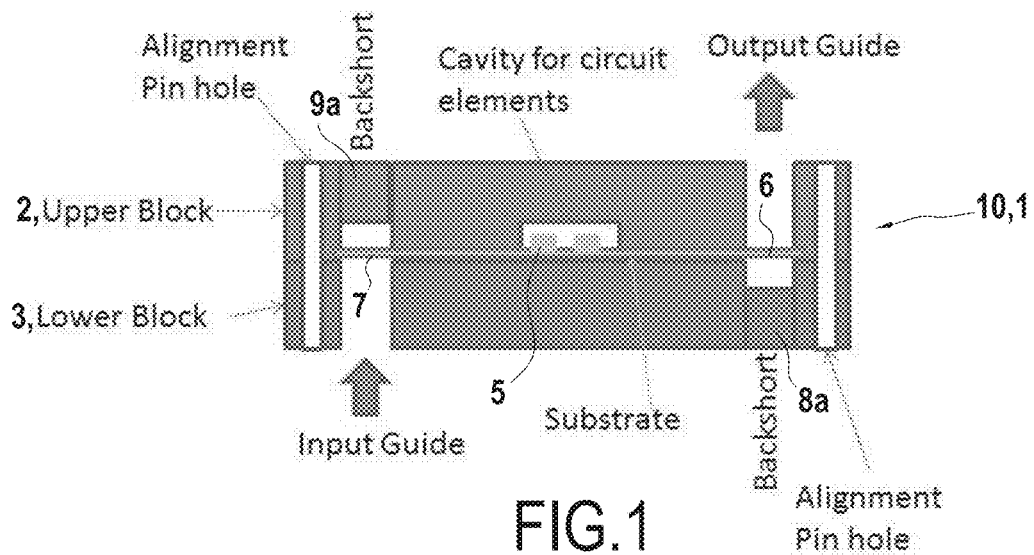
FIG. 1 shows a schematic representation of a side view of an electronic circuit according to an embodiment of the present disclosure.

FIG. 1 shows a schematic representation of a side view of an electronic circuit according to an embodiment of the present disclosure. A circuit block 10 comprises the electronic circuit 1, a lower block 3, an upper block 2 and a substrate 4 (including at least parts of circuit 1).

The lower and the upper block consist of dielectric, metallic or metal-doped dielectric material. The electronic components 5 of the circuit 1 are placed on the substrate 4. The substrate contains radiating elements 6, 7 that serve as input and output terminals for radiofrequency signals.

The lower block provides a guiding structure 9 (e.g. a waveguide) to allow input signals to interact with the radiating element on the circuit substrate. The upper block exhibits a suitable tuning structure 9a if required (e.g. backshort). This serves to optimize signal reception by the radiating element. The upper block provides a guiding structure 8 (e.g. a waveguide) as well. This to allow output signals to leave the circuit for further processing or radiation into free space. The lower block exhibits a suitable tuning structure 8a if required (e.g. backshort). This serves to optimize signal transmission by the radiating element.

Figure 2:
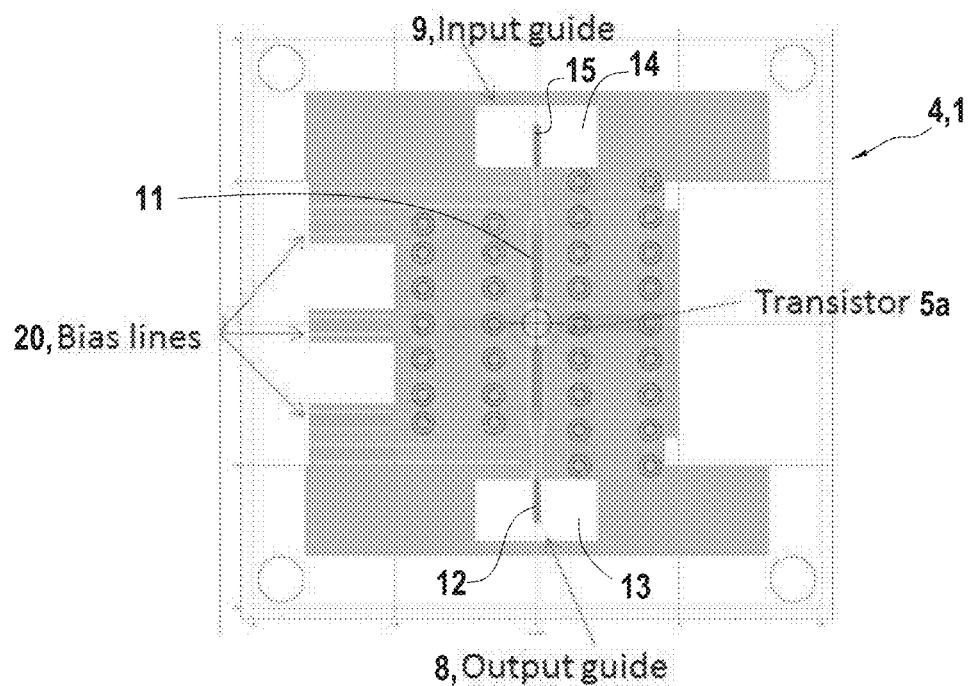
FIG. 2 shows a schematic representation of a top view of an electronic circuit according to an embodiment of the present disclosure, in particular that one of FIG. 1.

FIG. 2 shows a schematic representation of a top view of an electronic circuit according to an embodiment of the present disclosure, in particular that one of FIG. 1. A substrate 4 of this type is suitable for usage in a circuit block 10 according to FIG. 1. Metallization of the substrate comprises wires 11 (on bottom and/or on top) and wires 12 (on top) of the circuit.

In the upper part of the substrate, there is a cutout 14 which fits the input waveguide 9 cross section. In this cross section, a waveguide probe 15 is visible. This probe couples the guided wave to a microstrip line. In the center of the circuit, a transistor 5 is placed. This unit serves as amplifier. The bias voltages required to operate the transistor are provided by lines 20 following known technologies.

In the lower part of the substrate, there is a cutout 13 which fits the output waveguide cross section 8. In this cross section, a waveguide probe 13 is visible. This probe couples the microstrip wave into the output waveguide. It is by no means required that the input guide and output guide should be placed symmetrically or have the same dimensions. In this specific example of signal amplifier, the placement and choice of dimensions as shown in FIG. 2 have proven to work well.

In the following an exemplary embodiment (Preferred Embodiment (PE) 1) of an Radiation Coupled Amplifier according to the disclosure is described in context of FIG. 1 and FIG. 2:

In the simplest application, an amplifier for a given RF frequency is designed. In contrast to DC-decouple input and output, a radiative element is added on the input and one on the output. Such an amplifier is shown in FIG. 2. Here the substrate is shown from a top view. The upper guide probe collects radiation inserted e.g. from below, the lower output guide probe radiates into another guide e.g. to further circuits located above this one.

Now to this circuit is put in a waveguide block. This is shown in FIG. 1. There the simplest case of a radiatively coupled circuit is disclosed. Radiation is inserted into the Input Guide, coupled to the input probe of the substrate, amplified, then coupled to the output probe in the Output guide. The amplified signal can then be recovered from the Output Guide.

The blocks forming the waveguides can be dielectric, metallic or metal-doped dielectric. The waveguides can be monomode, multimode, polarization-dependent or not. The waveguides can be formed of metamaterials, photonic crystals.

Using oversized guiding structures that allow many modes to propagate, one refers to such an amplifier as quasioptical amplifier. Constructing such an amplifier in plain space (where radiation coupling may be an issue), would constitute such a quasioptical system.

Figure 3:
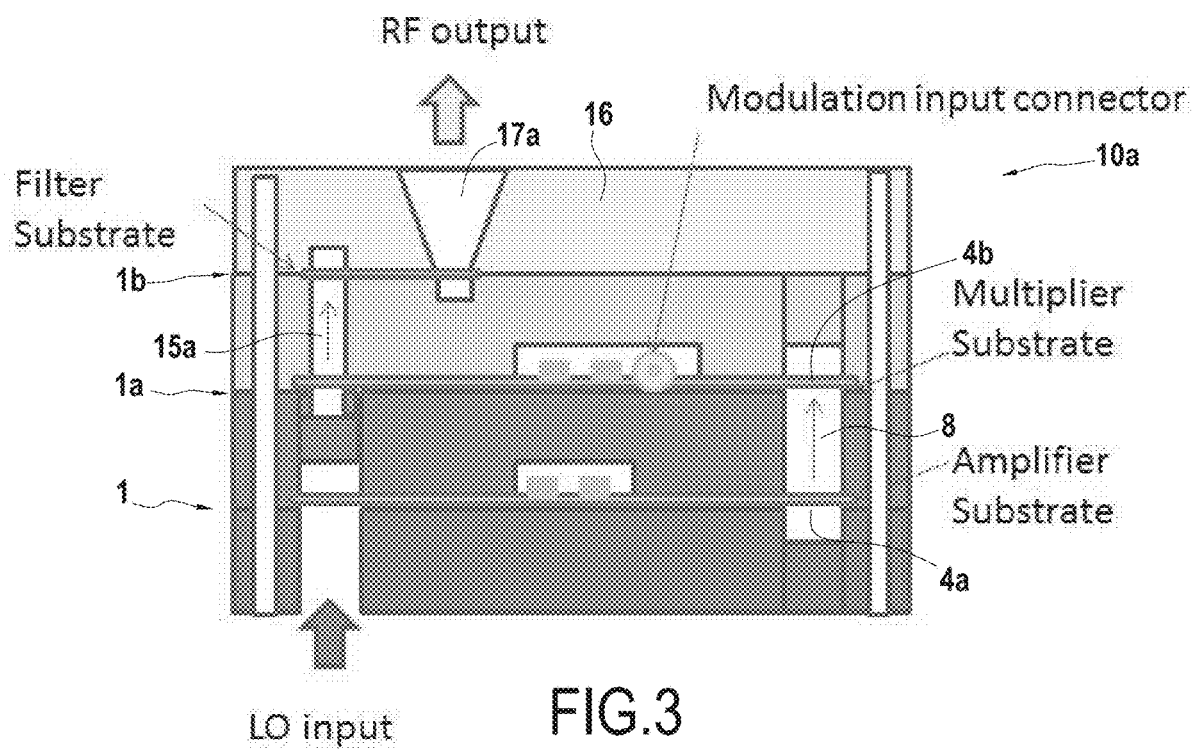
FIG. 3 shows a schematic representation of stacked radiation coupled electronic circuits for beam generation according to an embodiment of the present disclosure.

FIG. 3 shows a schematic representation of stacked radiation coupled electronic circuits for beam generation, i.e. a "Transmit block" according to an embodiment of the present disclosure. This circuit block 10a is similar to FIG. 1. Here two additional blocks have been added on top. On top of the output guide 8 as shown in FIG. 1, a second circuit 1a is placed where a radiating element collects the field in the waveguide Similar to the input guide, there is a suitable tuning element placed on top of this guide. The second circuit 1a serves as frequency multiplier (e.g. doubler or tripler).

The tripled signal is transferred to another radiating element on the far end of the second circuit 1a. At this stage, an external IF (Intermediate Frequency) signal may be added and modulates the signal. There, an output guide 15a is placed together with a suitable tuning element. This output guide has reduced dimensions since the RF (Radio Frequency) signal frequency is higher. This case serves as a typical example.

Any guides can be positioned freely and dimensioned freely in this invention. On top of the block covering the multiplier, a third circuit 1b is placed, e.g. for signal filtering or other purposes. The fourth and top layer 16 of the circuit contains a horn antenna 17a that serves as an interface to radiate the processed fields into free space.

In the following an exemplary embodiment of an Radiation Coupled Transmitter (Preferred Embodiment (PE) 2) according to the disclosure is described in context of FIG. 3:

Designing systems with output signals at >100 GHz requires the usage of power amplifiers at a reasonably high frequency followed by the usage of passive multipliers. Taking the design from Preferred Embodiment (PE) 1, another layer is added with another radiatively coupled unit. This time, a frequency multiplier is added (based on known Diodes or Transistors run in nonlinear regimes). As an option, one can modulate the bias voltage of the multiplier in order to obtain a FM generator.

Here a Transmit waveguide may be used after the multiplier that is structurally distinct from the input waveguide.

Also an integrated horn antenna may be used in the top block to add as transformer between the guided and the free space waves.

Figure 4:
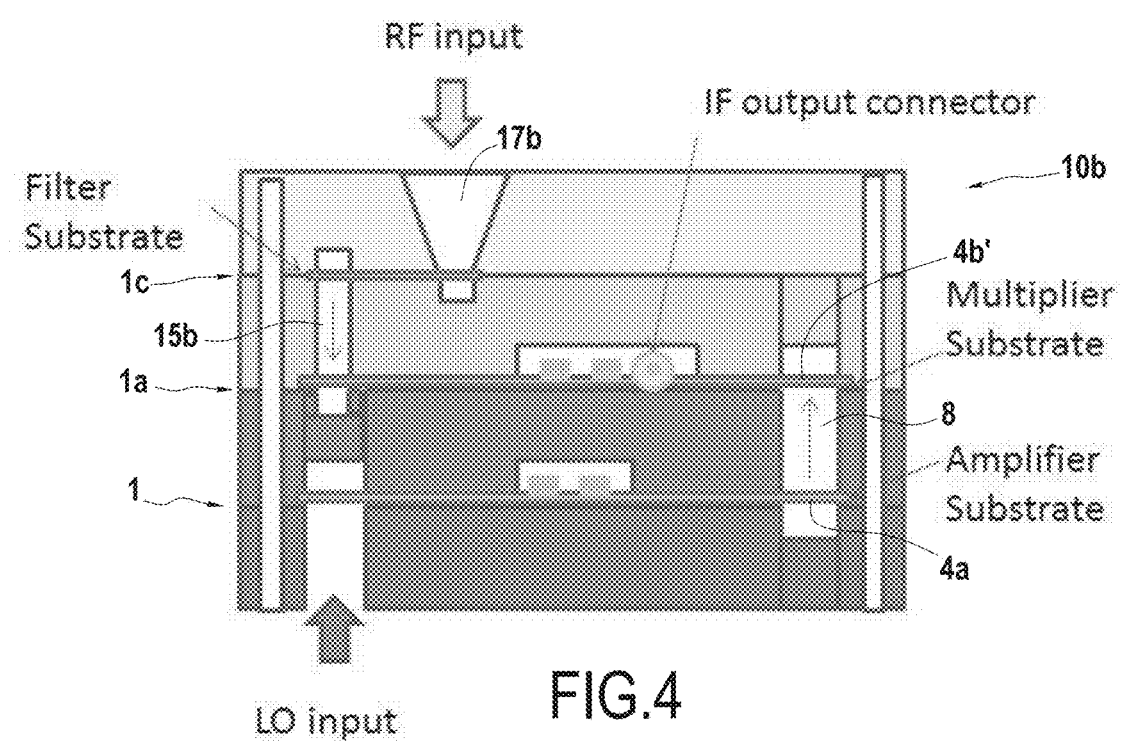
FIG. 4 shows a schematic representation of a stacked radiation coupled electronic circuits for a heterodyne receiver block according to an embodiment of the present disclosure.

FIG. 4 shows a schematic representation of a stacked radiation coupled electronic circuits for a heterodyne receiver block 10b according to an embodiment of the present disclosure. This circuit block 10b generally corresponds to the "Transmit block" 10a of FIG. 3. The only difference is that the direction of field propagation in the horn 17b, the filter 1c and the upper left waveguide section 15b are turned around. This block collects incoming RF signals, filters the signal (in the topmost layer, i.e. topmost electronic circuit 1c), transfers it to a multiplier 4b' that here is used as subharmonic mixer. The local oscillator signal for the mixer is fed by the amplifier. In this section, signal direction is not reversed. The downconverted IF signal (difference frequency between RF input and LO (Local Oscillator)) is available at a connector (not shown).

In the following an exemplary embodiment of an Radiation Coupled Receiver (Preferred Embodiment (PE) 3) according to the disclosure is described in context of FIG. 4:

Taking the system from PE2, signal propagation direction is simply reversed. Now, a RF filter may be placed directly after the receive horn and instead of feeding a modulation signal into the multiplier, an IF signal may be read out that corresponds to a subharmonically mixed signal.

Figure 5:
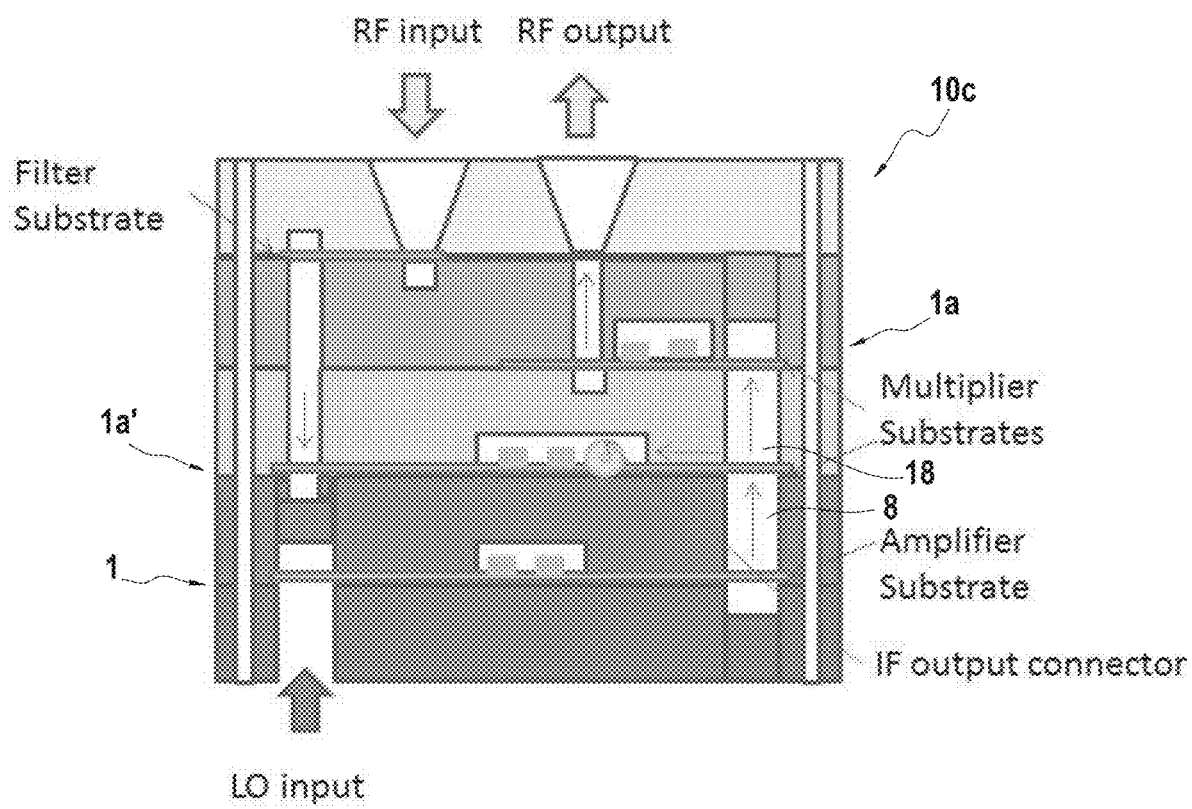
FIG. 5 shows a schematic representation of a stacked radiation coupled electronic circuits for a transceiver block according to an embodiment of the present disclosure.

FIG. 5 shows a schematic representation of a stacked radiation coupled electronic circuits for a transceiver block 10c according to an embodiment of the present disclosure. This block 10c combines Receive and Transmit blocks 10a, 10b from previous FIGS. 3 and 4. FIG. 5 discloses the usage of a radiative element 18 as power splitter: In the lower waveguide 8, the amplified LO signal travels upwards. A part is collected by the second substrate and feeds the subharmonic mixer multiplier 1a', the rest is used to multiply the transmit signal, i.e. to feed the electronic circuit 1a.

Figure 6:
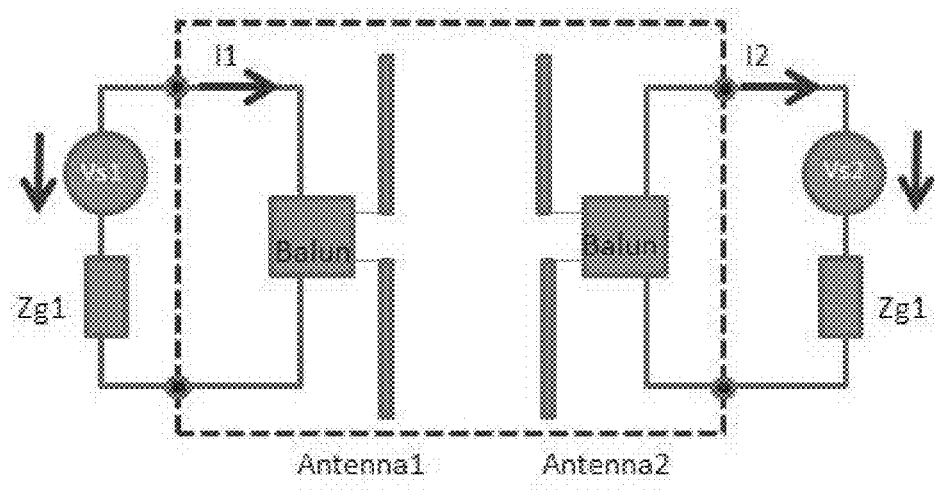
FIG. 6 shows a schematic representation of an equivalent circuit of two antennas at close distance.
Figure 7:
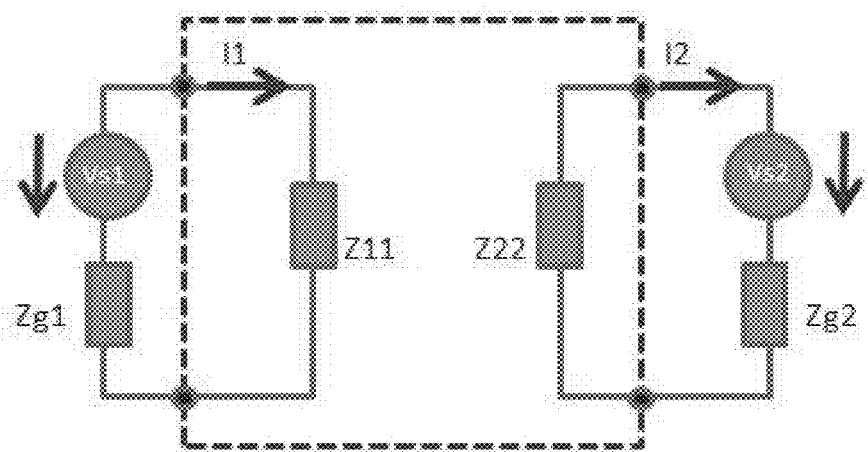
FIG. 7 shows a schematic representation of a conventional optimization and matching neglecting coupling between antennas as general background of the disclosure.

In the following an exemplary embodiment of an Radiation Coupled Transceiver (Preferred Embodiment (PE) 4) according to the disclosure is described in context of FIG. 5:

Constructing RADAR systems involving a multitude of pixels, this is the typical building brick of this invention: We superimpose a system from PE2 and PE3 in one block. Due to the three-dimensional nature of the blocks this is not a bigger problem. In this Preferred Embodiment we implement another, new function: One can use radiative elements as power splitter (and directional couplers) as well. In this circuit, we have to split the generated LO signal into a branch used for transmit and another branch used to downconvert the returning signal FIG. 6 shows a schematic representation of an equivalent circuit of two antennas at close distance. FIG. 6 discloses an equivalent circuit with two antennas coupled to two distinct sources. The source voltage of the first source is denoted Vs1, the source voltage of the second source is Vs2. The source impedance of the first source is denoted as Zg1 and Zg2 for the second source respectively. The current into the first antenna is I1 and the current coming from the second is I2. The antenna is symbolized by a dipole antenna. There is a balun required between the (non-symmetric) voltage and current two pole and between the antenna that requires symmetric voltages and currents on its arms FIG. 7 shows a schematic representation of a conventional optimization and matching neglecting coupling between antennas as general background of the disclosure. FIG. 7 discloses an equivalent circuit with two antennas coupled to two distinct sources where mutual coupling between the antennas is not taken into account. Using Antenna Theory theorems, each antenna configuration corresponds to a specific power transferred which in turn is modelled as an antenna impedance equivalent. Suitable values for this impedance are well known from the art. Its value for the first antenna is denoted Z11, for the second Z22.

Figure 8:
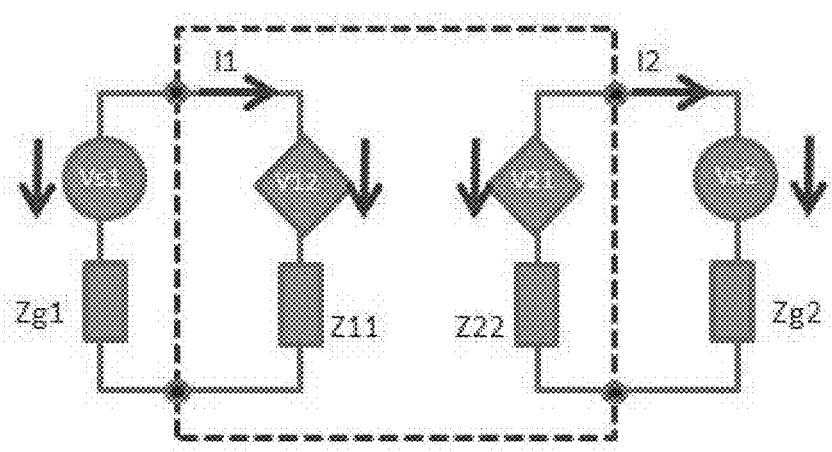
FIG. 8 shows a schematic representation of an optimization and matching that includes mutual coupling between antennas as general background of the disclosure.

FIG. 8 shows a schematic representation of an optimization and matching that includes mutual coupling between antennas as general background of the disclosure. FIG. 8 discloses an equivalent circuit with two antennas coupled to two distinct sources where mutual coupling between the antennas is indeed taken into account. The mutual coupling between the antennas is reflected in the presence of controlled voltage sources. The voltage on the first antenna (that depends on the current exiting of the second antenna) is denoted V12, the voltage on the second antenna depending on the current inserted into the first antenna is denoted V21. The circuit in FIG. 8 is used to reformulate the design rules for the two antennas.

Figure 9:
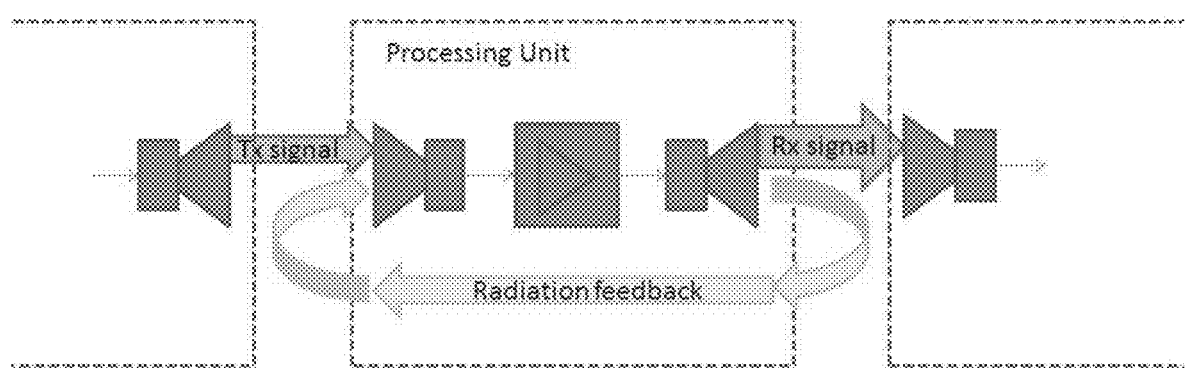
FIG. 9 shows a schematic representation of radiation feedback at radiation coupled circuits.

FIG. 9 shows a schematic representation of radiation feedback at radiation coupled circuits. FIG. 9 discloses a chain of radiation coupled processing units. The processing unit has a radiating device to receive power from a previous processing unit (denoted as Tx signal). The processing unit is characterized by a system function which is known from the art. The signal processed by the unit is emitted using another radiating device. The signal is denoted as Rx signal. This notion corresponds to the "generator system" logic used in Electrical Engineering. In addition to conventional processing units, there is coupling between the emitting and the receiving radiating unit. This term is referred to as Radiation feedback.

Since this coupling is not present in design processes of the Prior Art, one has to incorporate these additional terms in the relation, on which the design relations are derived and one has to re-do these steps. As an intuitive rule, the overall system will be unstable when the loop gain along the Radiation feedback path will exceed unity.

Figure 10:
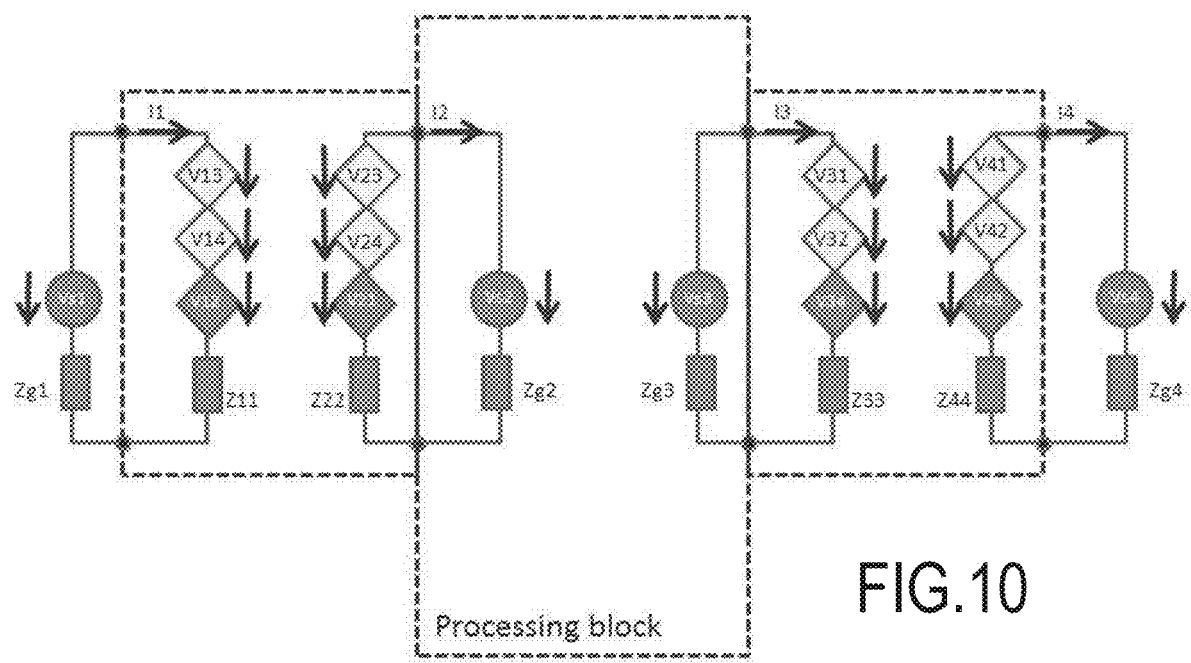
FIG. 10 shows a schematic representation of an equivalent circuit for a processing block taking into account all parasitic couplings.

FIG. 10 shows a schematic representation of an equivalent circuit for a processing block taking into account all parasitic couplings. FIG. 10 discloses an equivalent circuit required to re-define design rules. All components of Prior Art are depicted as filled items. The components enforced by this present disclosure are depicted as non-filled circuit components. The coupling coefficients of the controlled voltage sources are determined using Electromagnetic Field Theory as known from the Prior Art.

Figure 11:
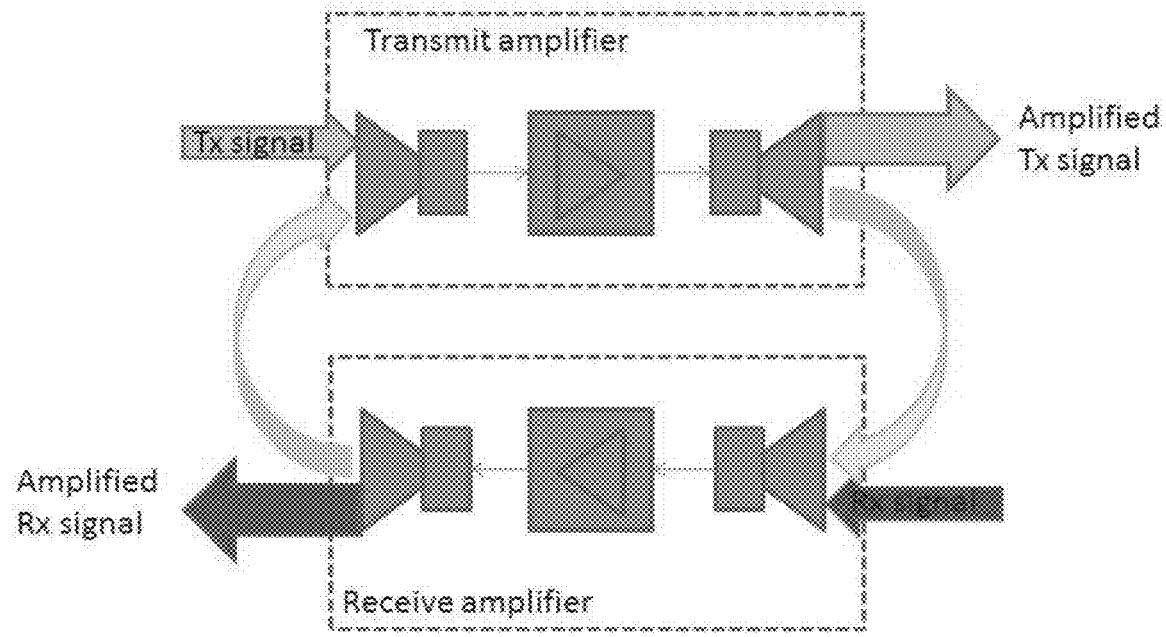
FIG. 11 shows a schematic representation of radiation feedback at closely spaced Tx and Rx stages.

FIG. 11 shows a schematic representation of radiation feedback at closely spaced Tx and Rx stages. FIG. 11 discloses a typical design problem when using radiation coupled processing units. In a radar application, there are a multitude of receivers and transmitters. Power levels in the receiver channels are much smaller than power levels in the transmit channels. As in the previous case, all radiating elements will couple to each other. Design measures are defined to engineer these couplings appropriately. Even here, as an intuitive rule, the overall system will be unstable when the loop gain along the Radiation feedback path will exceed unity.

Figure 12A:
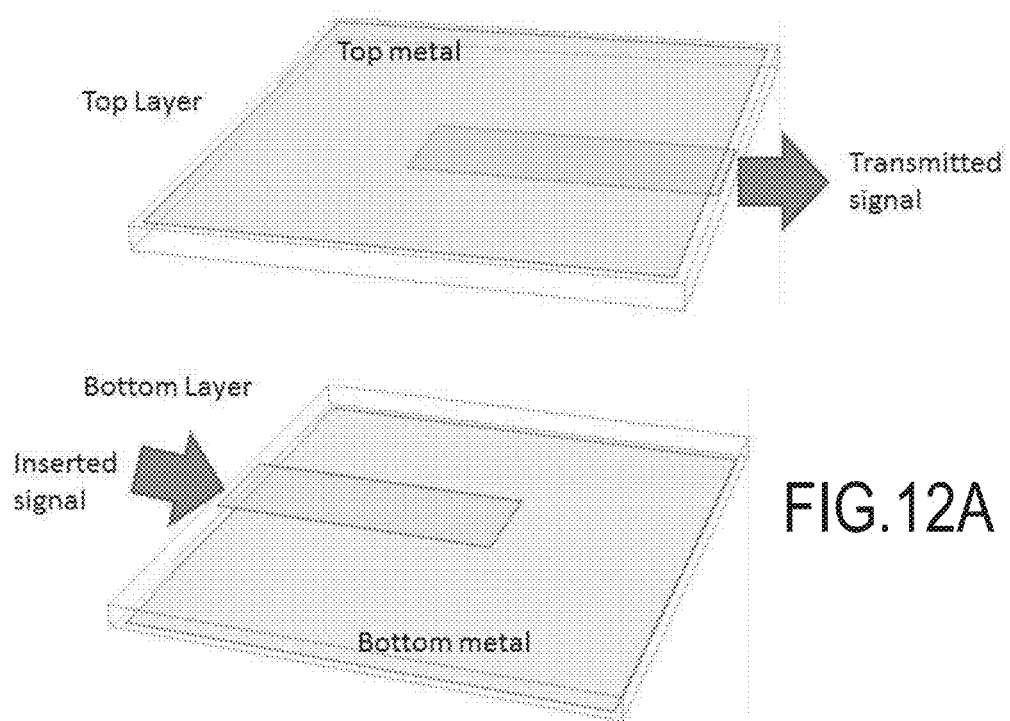
FIGS. 12a and 12b show schematic representations of a capacitive coupler created by close by pcb layers.
Figure 12B:
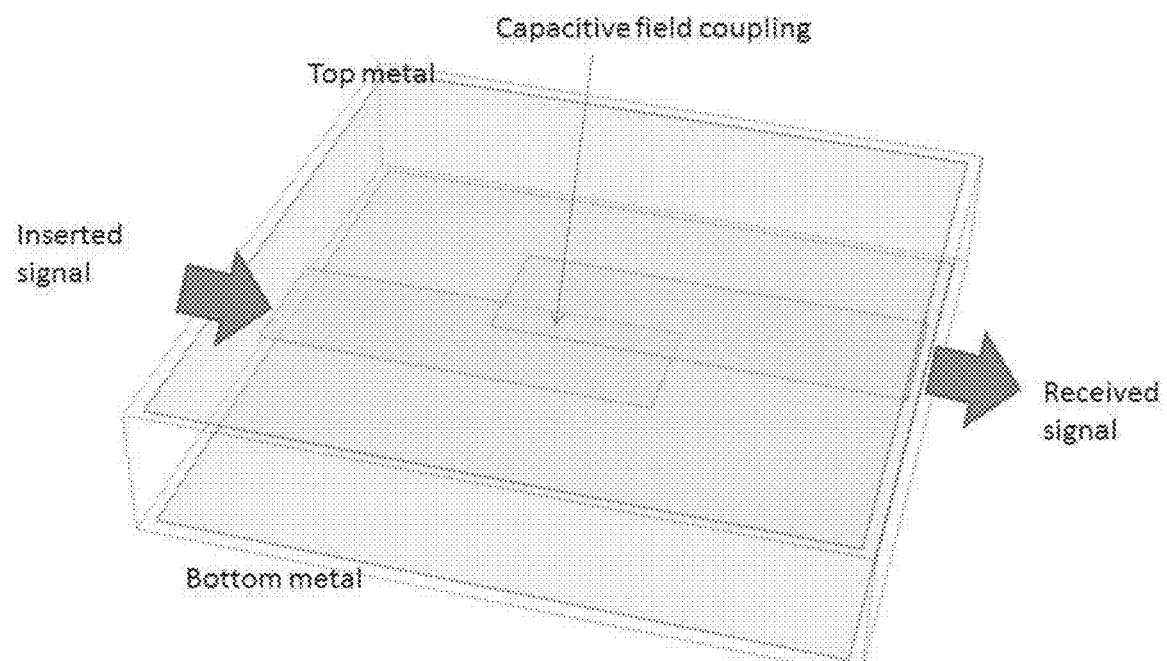

FIGS. 12a and 12b show schematic representations of a capacitive coupler created by close by pcb layers. FIGS. 12a and b disclose how to make a capacitive coupling between different layers by superimposing printed circuit boards. It should be noted, that the microstrip width can be fine-tuned to accommodate mutual coupling for proper operation (FIG. 12a as exploded view and FIG. 12b as assembled view).

Figure 13A:
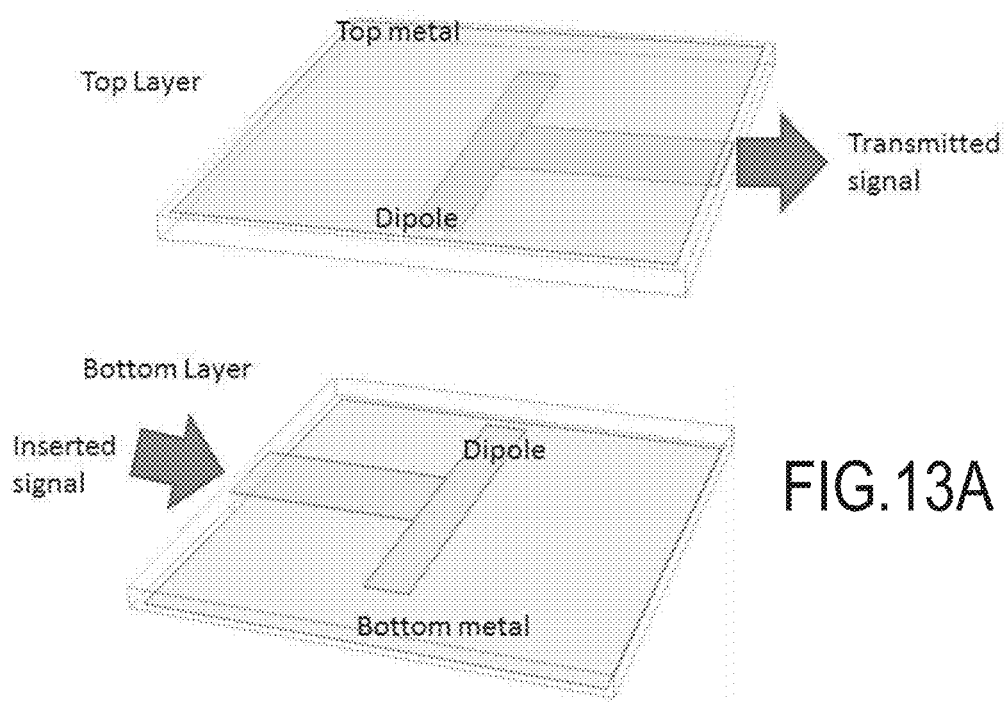
FIGS. 13a and 13b show schematic representations of an antenna coupler created by close by pcb layers.
Figure 13B:
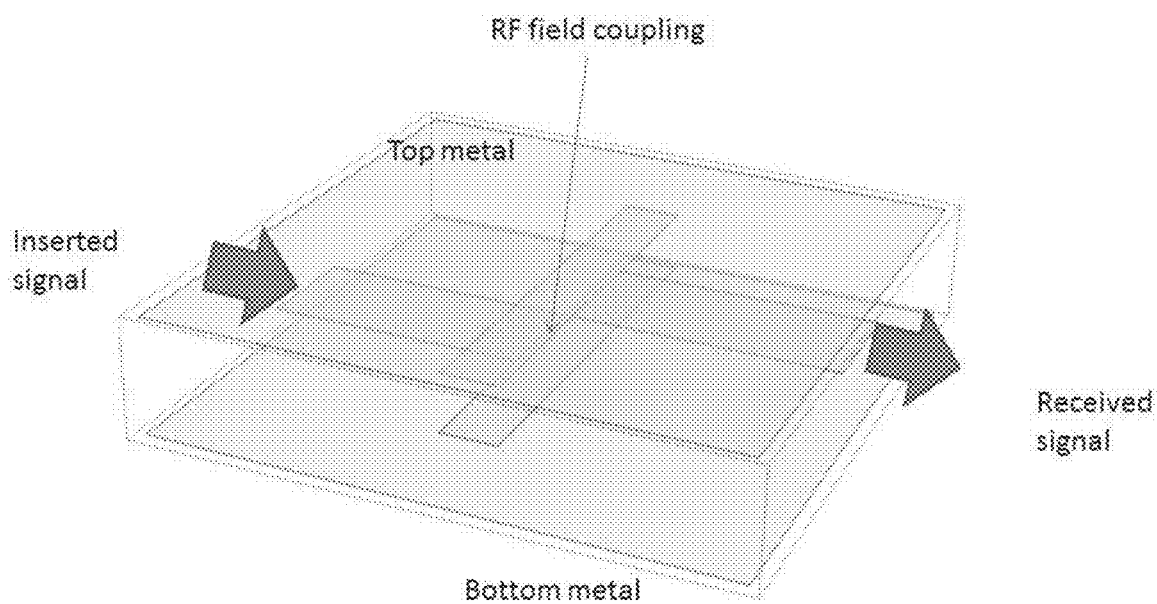

FIGS. 13a and 13b show schematic representations of an antenna coupler created by close by pcb layers. FIGS. 13a and b disclose how to make a resonant (antenna) coupling between different layers by superimposing printed circuit boards. It is noted again, that the microstrip width can be fine-tuned to accommodate mutual coupling for proper operation (FIG. 13a as exploded view and FIG. 13b as assembled view).

In the following an exemplary design process according to the disclosure is described in context of FIGS. 6 to 8:

A: The Uncoupled Case (0th Approximation)

Considering two radiative elements (e.g. antennas or any other circuit element capable of creating a near field), the transfer properties between these are analyzed. This is depicted in FIG. 6.

One source (with given source impedance) is coupled to a radiative element. The circuit element in-between is a balun. Baluns are required if the radiative element (e.g. a dipole) must be fed with a symmetric voltage and the external circuit is grounded on one terminal.

Using Antenna Theory effective antenna impedances can be derived for any radiating structure for any distances. In this case, Antenna Theory (or better a Theory of Coupled Electromagnetic Fields) is used prior to any far field approximations. With the proper assumptions, one can derive an effective antenna impedance for any radiating structure for any distance.

This antenna impedance is depicted in the Equivalent Circuit of FIG. 7. Here both radiating elements are uncoupled. Thus no power is transferred between them.

Under this condition (and only under this condition) the antenna impedance (here Z11 and Z22) may be treated constant. It is noted that the concept of antenna impedance is in the usage of an antenna as far field transmitter. In this disclosure, power between these terminals should be transferred.

B: The Coupled Case (1th Approximation)

Taking into account antenna coupling, again Antenna Theory is consulted to yield effective coupling factors between the radiative elements. As in the above case, coupling factors are extracted prior to any textbook approximation. This is possible even in analytically closed form.

The coupling between two radiative elements is described in the Art as Mutual Coupling. Here this coupling is adapted to the near field. This coupling is then added as controlled voltage sources in the equivalent circuit. FIG. 8 depicts such a case, where an additional voltage V12 depending on I2 and adding on the first source is indicated as controlled source. Due to symmetry there is another additional voltage V21 depending on I1 and adding on the second source as well. The coefficients of coupling are given in the form of mutual impedances.

So instead of matching the sources to the antenna impedance, the sources are matched to a sum of mutual impedances and antenna impedances. This requires changes in the antenna's physical size or the transmission line's characteristic impedance.

There are cases, where the mutual coupling is dominant over the antenna impedance. In these cases there is a crossover between a transmission line and an antenna. The only point that will in the end distinguish antennas from transmission lines are the existence of a discrete resonance frequency spectrum.

C: Radiation Feedback

At this point, it is possible to construct a radiative coupled circuit. In contrast to the Prior Art, Input part and Output part of this circuit cannot be insulated arbitrarily. There will be always a fraction of mutual coupling between these radiative elements. This coupling must be taken into account. A typical situation is shown in FIG. 9.

The equivalent circuit used for modelling is shown in FIG. 10. There, all components present in Prior Art are depicted as filled components, those being a consequence of the present disclosure are depicted non-filled.

In order to achieve optimum power transmission, the matching conditions are optimized by solving this matching problem. Using the concepts of amplifier and oscillator design to the facts given in literature, one has to add an overall feedback level on these design rules and re-derive them.

As a side remark, any high frequency circuit can be treated as a series of radiative elements and we will finally have to model complete circuits as field problems. Today's transmission line approximations and modelling tools will be obsolete for frequencies above 150 GHz.

D: Worst Case of Radiation Feedback

The present disclosure is intended to allow compact and cost-effective construction of imaging RADAR systems. There a large number of antennas is needed, a large number of amplifiers, bias circuits etc. Constructing a cell based radar pixel using this invention, many circuits are to be constructed as those described in FIG. 5.

Here, it is noted that stability requires (at least) that the overall gain between the transmitted signal, its amplification, its coupling to the receiver, its amplification in the receiver and the coupling to the initial signal must be much smaller than unity. (Modified Loop Gain criterion). It is obvious that a forward amplification of 30 dB and a signal recovery amplification of 60 dB requires the radiation coupling of the parasitic signal not to exceed −90 dB for both couplers.

E: Capacitive Coupler

The easiest (and broadband) way to couple signals from one printed board to the next is to use a microstrip stub on both substrates and place these substrates close to each other (without making galvanic contact). This situation is shown in FIG. 12a and b.

The microstrip stub may be formed as fans on both or one side to further enlarge coupling efficiency.

F: Dipole Coupler

The simplest antenna case (being the symbolic base of PE.1) consists of coupling signals from one printed board to a dipole and place these substrates at a distance, where the matching compensates for mutual coupling (without making galvanic contact). This situation is shown in FIG. 13a and b.

For proper operation, the mutual coupling must be taken into account for the insertion loss and transfer properties as previously mentioned.

Throughout the disclosure, including the claims, the term "comprising a" should be understood as being synonymous with "comprising at least one" unless otherwise stated. In addition, any range set forth in the description, including the claims should be understood as including its end value(s) unless otherwise stated. Specific values for described elements should be understood to be within accepted manufacturing or industry tolerances known to one of skill in the art, and any use of the terms "substantially" and/or "approximately" and/or "generally" should be understood to mean falling within such accepted tolerances.

Furthermore the terms like "upper", "upmost", "lower" or "lowest" and suchlike are to be understood as functional terms which define the relation of the single elements to each other but not their absolute position.

Where any standards of national, international, or other standards body are referenced (e.g., ISO, etc.), such references are intended to refer to the standard as defined by the national or international standards body as of the priority date of the present specification. Any subsequent substantive changes to such standards are not intended to modify the scope and/or definitions of the present disclosure and/or claims.

Although the present disclosure herein has been described with reference to particular embodiments, it is to be understood that these embodiments are merely illustrative of the principles and applications of the present disclosure.

It is intended that the specification and examples be considered as exemplary only, with a true scope of the disclosure being indicated by the following claims.

The invention claimed is:

1. An electronic circuit having a three-dimensional design comprising: a set of two-dimensional electronic circuits coupled with each other only by radiation, wherein the two-dimensional electronic circuits comprise radiative elements,
   the radiative elements being arranged on the two-dimensional electronic circuits and in the near field of each other and are configured to provide the coupling between the two-dimensional electronic circuits, and further comprising
      guiding structures arranged between the radiative elements configured to modify the coupling field between the radiative elements,
      wherein, at least one of the two-dimensional electronic circuits comprises a radiative element configured to split an amplification power for amplifying an electric output signal and an electric input signal.

2. The electronic circuit according to claim 1, wherein the coupling between the two-dimensional electronic circuits is at least one of the following couplings: a capacitive coupling, an inductive coupling and a resonant antenna coupling.

3. The electronic circuit according to claim 1, wherein the set of two-dimensional electronic circuits are stacked.

4. The electronic circuit according to claim 1, configured to generate an electric output signal in a first one of the set of two-dimensional electronic circuits, the electric output signal being transmitted via radiation to a second one of the set of two-dimensional electronic circuit,
   the electric output signal being processed in at least one of the two-dimensional electronic circuits.

5. The electronic circuit according to claim 4, wherein at least one of the two-dimensional electronic circuits comprises at least one of the following:
   a radiation coupled amplifier configured to amplify the electric output signal, and
   a radiation coupled transmitter configured to multiply a frequency of the electric output signal.

6. The electronic circuit according to claim 1, configured to receive an electric input signal in a last one of the set of two-dimensional electronic circuits,
   the electric input signal being transmitted via radiation to a preceding one of the set of two-dimensional electronic circuits,
   the electric input signal being processed in at least one of the two-dimensional electronic circuits.

7. The electronic circuit of claim 4, wherein at least one of the two-dimensional electronic circuits comprises at least one of:
   a radiation coupled receiver configured to filter the electric input signal, and
   a radiation coupled amplifier configured to amplify the electric input signal.

8. The electronic circuit according to claim 1, wherein at least one of the two-dimensional electronic circuits comprises a radiation coupled transceiver configured to process an electric output signal and an electric input signal.

9. An antenna system, comprising:
   an electronic circuit according to claim 1 configured to generate a radio output signal.

10. The antenna system of claim 9, comprising a horn antenna arranged on a last one of the set of two-dimensional electronic circuits,
    the horn antenna being configured to transform a guided electric output signal into the radio output signal of the antenna system.

11. The antenna system according to claim 9, comprising a horn antenna arranged on a last one of the set of two-dimensional electronic circuits,
    the horn antenna being configured to transform a radio input signal into a guided electric input signal.

12. A radar antenna system, comprising: an array of a plurality of antenna systems each comprising an electronic circuit and having a three-dimensional design by comprising a set of two-dimensional electronic circuits which are coupled with each other only by radiation,
    wherein, at least one of the two-dimensional electronic circuits comprises a radiative element configured to split an amplification power for amplifying an electric output signal and an electric input signal.

13. The radar antenna system according to claim 12, wherein the set of two-dimensional electronic circuits comprising a plurality of stacked two-dimensional electronic circuits, wherein at least one is shared by the plurality of antenna systems of the array.

14. The radar antenna system according to claim 12, wherein the antenna systems comprise at least one two-dimensional electronic circuit configured to be operated at a frequency smaller than a predetermined frequency.

15. The radar antenna system according to claim 12, wherein each of the antenna systems comprises at least one separate two-dimensional electronic circuit configured to be operated at a frequency greater than a predetermined frequency.

* * * * *